(12) United States Patent
Lu

(10) Patent No.: US 6,940,480 B2
(45) Date of Patent: *Sep. 6, 2005

(54) PIXEL STRUCTURE

(75) Inventor: An-Hsu Lu, Taoyuan (TW)

(73) Assignee: Quanta Display Inc., Tauyuan (TW)

( * ) Notice: Subject to any disclaimer, the term of this patent is extended or adjusted under 35 U.S.C. 154(b) by 300 days.

This patent is subject to a terminal disclaimer.

(21) Appl. No.: 10/248,575

(22) Filed: Jan. 30, 2003

(65) Prior Publication Data

US 2004/0104879 A1 Jun. 3, 2004

(30) Foreign Application Priority Data

Dec. 3, 2002 (TW) ........................................ 91134998 A

(51) Int. Cl.[7] ................................................. G09G 3/36
(52) U.S. Cl. ............................. 345/92; 349/114; 349/43
(58) Field of Search ............................ 345/87, 92, 90, 345/204–206; 349/43, 56, 114

(56) References Cited

U.S. PATENT DOCUMENTS 5,789,762 A * 8/1998 Koyama et al. .............. 257/66
6,166,786 A * 12/2000 Ohkubo et al. ............... 349/43
6,388,653 B1 * 5/2002 Goto et al. .................... 345/98
6,773,971 B1 * 8/2004 Zhang et al. ................. 438/163
6,819,385 B2 * 11/2004 Lu ............................. 349/144
2003/0089910 A1 * 5/2003 Inukai ......................... 257/66

* cited by examiner

*Primary Examiner*—Ricardo Osorio
(74) *Attorney, Agent, or Firm*—Jianq Chyun IP office

(57) ABSTRACT

A pixel structure on a substrate is provided. The pixel structure includes a scan line, a gate dielectric layer, a data line, a passivation layer, a transparent pixel electrode and a double drain thin film transistor (double drain TFT). The scan line is positioned over the substrate and the gate dielectric layer is positioned over the substrate covering the scan line. The data line is positioned over the gate dielectric layer. The data line extends in a direction different from the scan line. The passivation layer is positioned over the gate dielectric layer covering the data line. The transparent pixel electrode is positioned over the passivation. The double drain TFT is positioned over the substrate in the middle of the pixel structure. The double drain TFT has a gate, a channel layer, a source and two drains. The source and the data line are electrically connected. The two drains are electrically connected to transparent pixel electrode. The channel layer is positioned over the gate dielectric layer above the gate. The gate and the scan line are electrically connected.

18 Claims, 7 Drawing Sheets

PIXEL STRUCTURE

CROSS REFERENCE TO RELATED APPLICATIONS

This application claims the priority benefit of Taiwan application serial No. 91134998, filed on Dec. 3, 2002.

BACKGROUND OF INVENTION

1. Field of Invention

The present invention relates to a semiconductor device structure. More particularly, the present invention relates to the pixel structure of a thin film transistor liquid crystal display (TFT-LCD).

2. Description of Related Art

A thin film transistor liquid crystal display (TFT-LCD) typically includes a thin film transistor array substrate, a color filter array substrate and a liquid crystal layer. The thin film transistor array substrate contains numerous pixel structures arranged to form an array. Each pixel structure at least includes a thin film transistor and a corresponding pixel electrode. Each thin film transistor has a gate, a channel layer, a drain and a source. The thin film transistor serves as a switching element for a single liquid crystal display unit.

FIG. 1 is the top view of a conventional pixel structure and FIG. 2 is a sectional view through line I–I" as shown in FIG. 1. To construct the pixel structure as shown in FIGS. 1 and 2, a gate 102 and a scan line 101 are formed over a substrate 100 such that the scan line 101 and the gate are connected. Thereafter, a gate dielectric layer 104 is formed over the substrate 100 covering the gate 102 and the scan line 101. An amorphous silicon channel layer 106 is next formed over the gate dielectric layer 104 above the gate 102 and then an ohmic contact 108 is formed over the amorphous silicon channel layer 106. Source/drain terminals 112a/112b are formed over the ohmic contact 108 and, at the same time, a data line 111 having connection with the source terminal 112a is patterned out above the gate dielectric layer 104. The gate 102, the channel layer 106, the source/drain terminals 112a/112b together constitute a thin film transistor 130. In a subsequent step, a passivation layer 114 is formed over the substrate 100 covering the thin film transistor 130. The passivation layer 114 is patterned to form an opening 116. Afterwards, a pixel electrode 118 is formed over the passivation layer 114. The pixel electrode 118 is electrically connected to the drain terminal 112b of the thin film transistor 130 through the opening 116.

The aforementioned pixel structure may further include a pixel storage capacitor 120 above a neighboring scan line 101a. The pixel storage capacitor 120 comprises of a scan line 101a (serving as a lower electrode), a conductive layer 124 and a pixel electrode 118 (serving as an upper electrode) above the scan line 101a and the gate dielectric layer 104 between the upper and the lower electrode. The conductive layer 124 and the pixel electrode 118 are electrically connected together through another opening 126 in the passivation layer 114.

Conventionally, the thin film transistor 130 for driving a pixel structure is typically located near one corner while the pixel storage capacitor 120 is over the scan line 101a. With this pixel structure design, pixels are easily contaminated by particles during the fabrication process leading to possible failure. In other words, if contaminating particles adhere to a particular location on the pixel structure to cause a local short circuit, the entire pixel structure may malfunction. Furthermore, the placement of the pixel storage capacitor 120 over the scan line 101a also requires an additional design stage to cater for the scanning waveform. Consequently, both the driving circuit and the fabrication process is more complicated.

SUMMARY OF THE INVENTION

Accordingly, one object of the present invention is to provide a pixel structure capable of improving the problems caused by the placement of the pixel structure in a conventional design.

To achieve these and other advantages and in accordance with the purpose of the invention, as embodied and broadly described herein, the invention provides a pixel structure on a substrate. The pixel structure includes a scan line, a gate dielectric layer, a data line, a passivation layer, a transparent pixel electrode and a double drain thin film transistor (double drain TFT). The scan line is positioned over the substrate and the gate dielectric layer is positioned over the substrate covering the scan line. The data line is positioned over the gate dielectric layer. The data line extends in a direction different from the scan line. The passivation layer is positioned over the gate dielectric layer covering the data line. The transparent pixel electrode is positioned over the passivation layer with that portion of the transparent pixel electrode above the scan line having a plurality of openings for reducing parasitic capacitance between the scan line and the transparent electrode. The double drain TFT is positioned over the substrate in the middle of the pixel structure. The double drain TFT has a gate, a channel layer, a source and two drains. The source and the data line are electrically connected. The two drains are electrically connected to the transparent pixel electrode. The channel layer is positioned over the gate dielectric layer above the gate. The source and the two drains are positioned over the channel layer. The gate and the scan line are electrically connected.

In this invention, the two edges of the pixel structure may further include two pixel storage capacitors. Each pixel storage capacitor includes a common line over the substrate (serving as a lower electrode), a conductive layer and a transparent electrode (serving as an upper electrode) above the common line and a gate dielectric layer between the upper electrode and the lower electrode. The conductive layer and the transparent pixel electrode are electrically connected through a contact in the passivation layer.

This invention also provides an alternative pixel structure on a substrate. The pixel structure includes a scan line, a gate dielectric layer, a data line, a reflective pixel electrode and a double drain thin film transistor (double drain TFT). The scan line is positioned over the substrate and the gate dielectric layer is positioned over the substrate covering the scan line. The data line is positioned over the gate dielectric layer. The data line extends in a direction different from the scan line. The reflective pixel electrode is positioned over the gate dielectric layer. The reflective pixel electrode may set up as two blocks of reflective pixel electrodes one on each side of the scan line or as a single block of reflective pixel electrode. However, the reflective pixel electrode above the scan line has a plurality of openings to reduce parasitic capacitance between the scan line and the reflective pixel electrode. The double TFT is positioned over the substrate in the middle of the pixel structure. The double drain TFT has a gate, a channel layer, a source and two drains. The source and the data line are electrically connected. The two drains are electrically connected to the reflective pixel electrode. The channel layer is positioned over the gate dielectric layer above the gate. The source and the two drains are positioned over the channel layer. The gate and the scan line are electrically connected.

In this invention, the two edges of the pixel structure may further include two pixel storage capacitors. Each pixel storage capacitor includes a common line over the substrate (serving as a lower electrode), a reflective pixel electrode (serving as an upper electrode) above the common line and a gate dielectric layer between the upper electrode and the lower electrode.

According to the structural design in this invention, the thin film transistor is positioned in the middle of the pixel structure and that the two drains of the thin film transistor are capable of driving the pixel electrode on each side. Hence, the pixel structure is less vulnerable to the damaging effect of contaminating particles.

By positioning the thin film transistor in the middle of the pixel structure, a more uniform electric field distribution across the surface of the pixel electrode is produced and hence has a positive effect on the display. Furthermore, unlike the conventional design of positioning the pixel storage capacitor over the scan line, the pixel structure according to this invention is not formed over a scan line and hence has a simpler driving circuit design.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
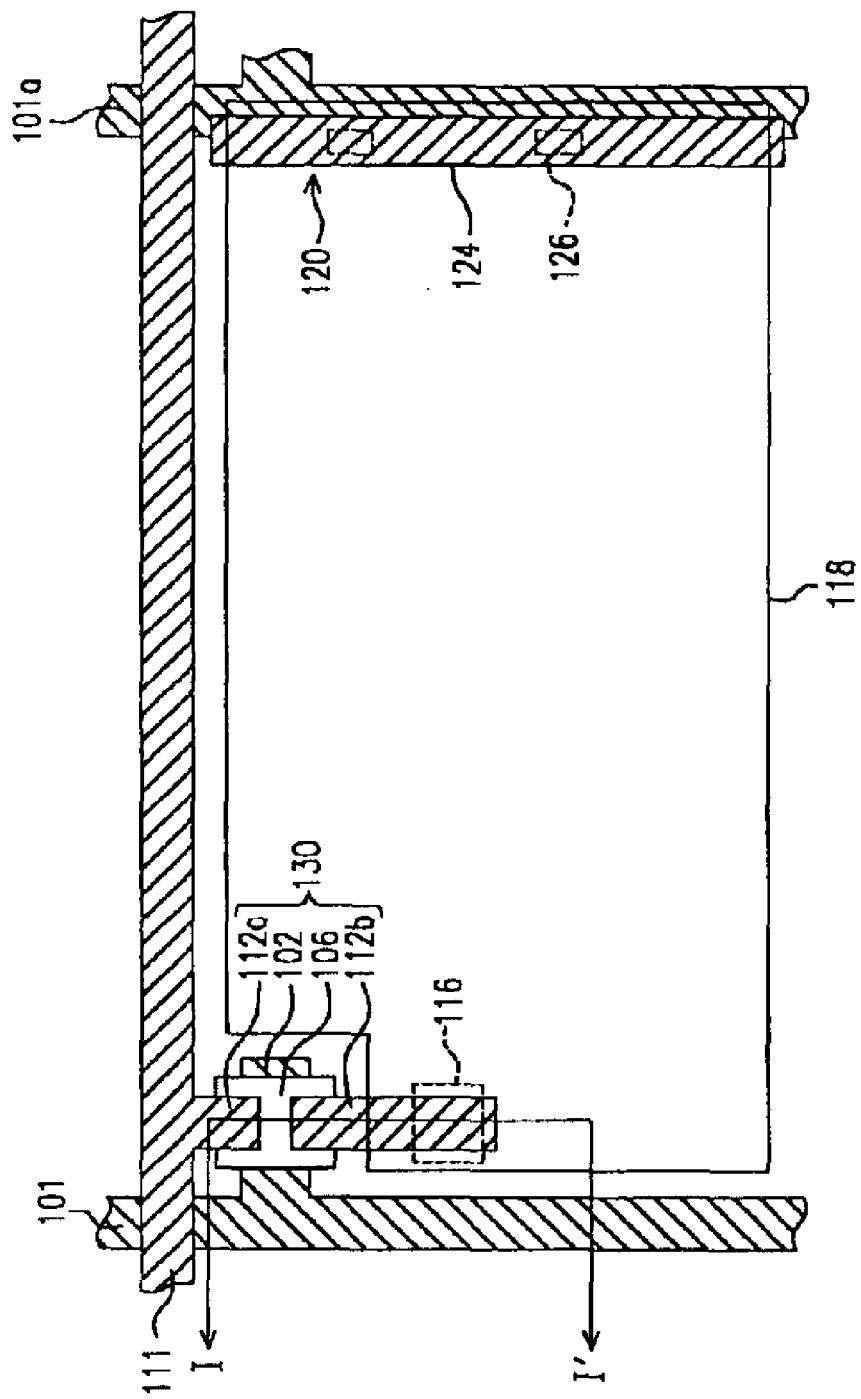
FIG. 1 is the top view of a conventional pixel structure.
Figure 2:
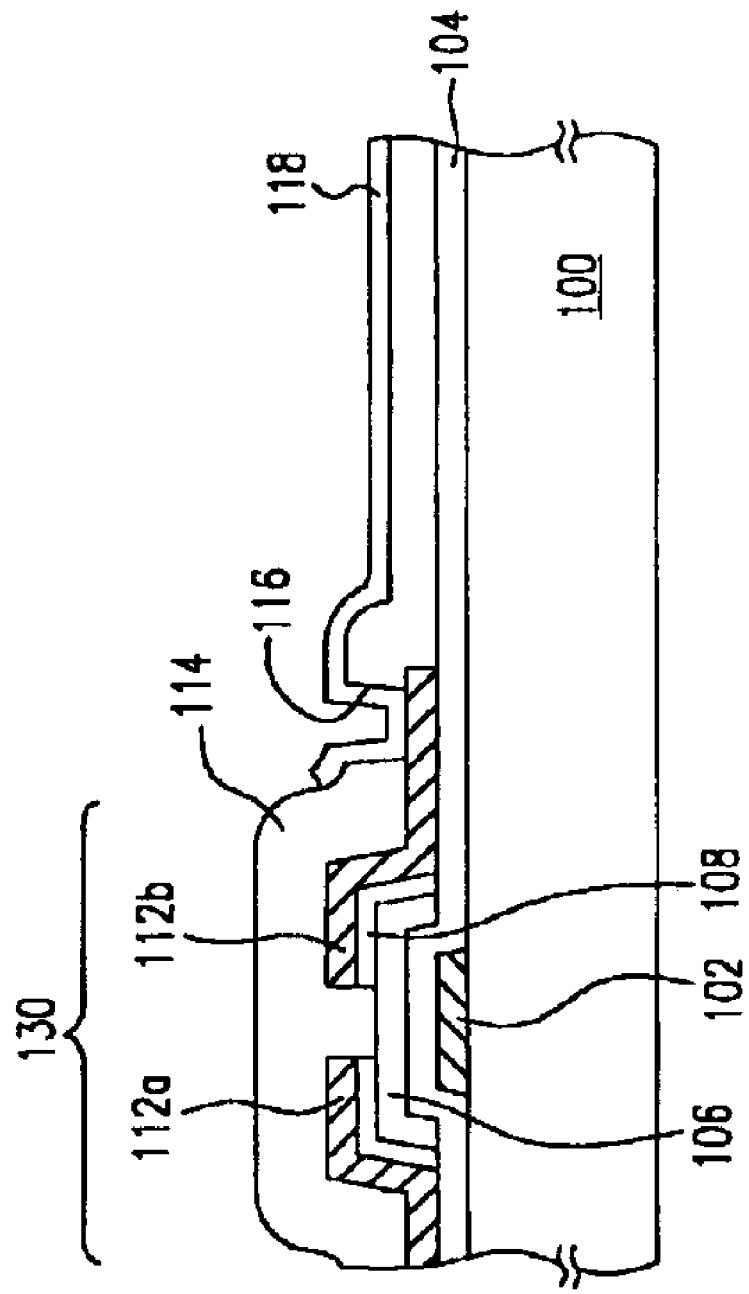
FIG. 2 is a sectional view through line I–I" as shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
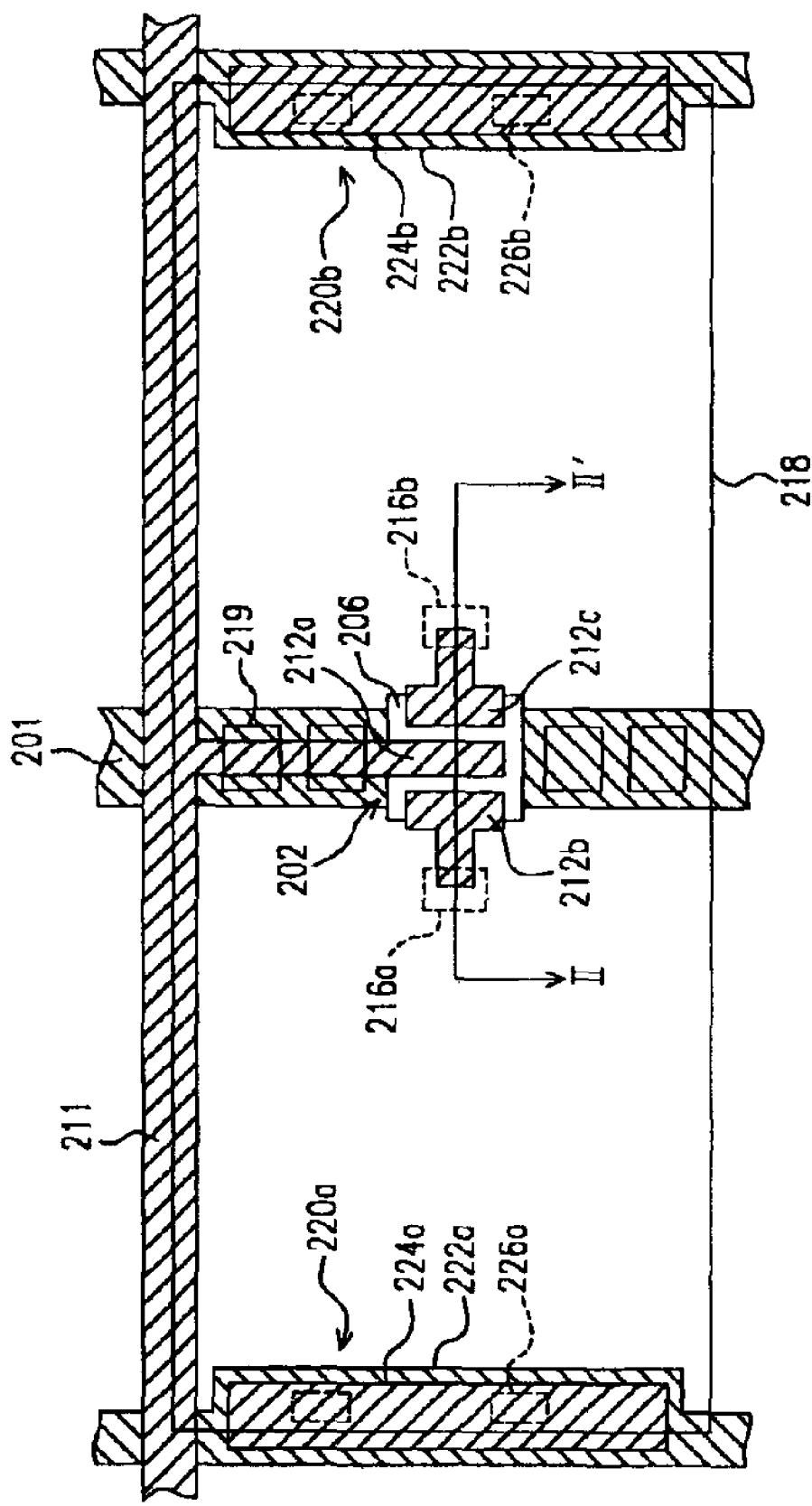
FIG. 3 is the top view of a pixel structure according to a first embodiment of this invention.
Figure 4:
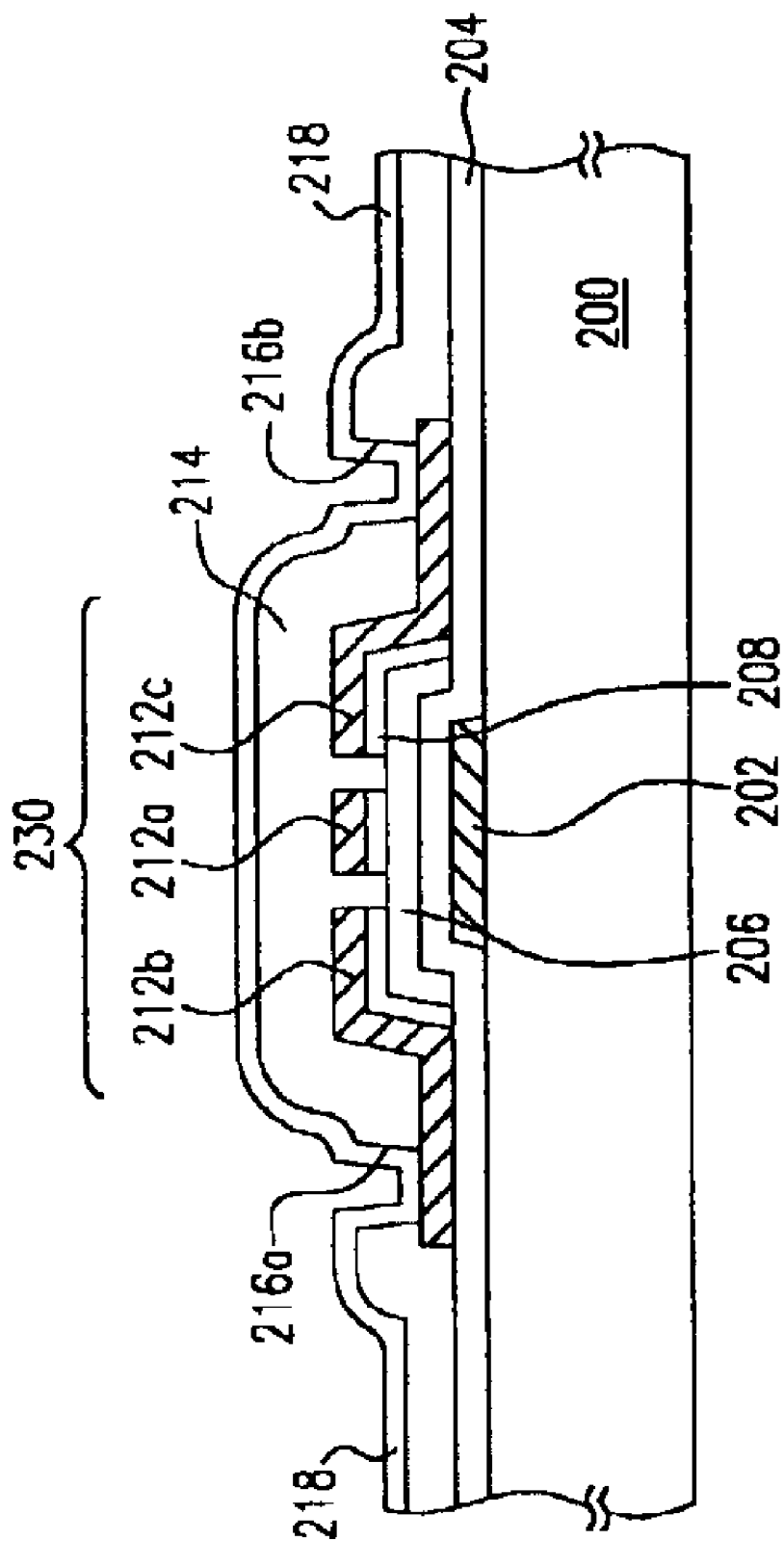
FIG. 4 is a sectional view through line II–II" as shown in FIG. 3.

FIG. 3 is the top view of a pixel structure according to a first embodiment of this invention and FIG. 4 is a sectional view through line II–II" as shown in FIG. 3. As shown in FIGS. 3 and 4, a substrate 200 such as a transparent glass substrate or a transparent plastic substrate is provided. A scan line 201 and a gate 202 are formed over the substrate 200 such that the scan line 201 and the gate 202 are electrically connected.

Thereafter, a gate dielectric layer 204 is formed over the substrate 200 globally covering the scan line 201 and the gate 202. The gate dielectric layer 204 is fabricated using a dielectric material including silicon nitride or silicon oxide, for example.

A channel layer 206 is formed over the gate dielectric layer 204 above the gate 202. The channel layer 206 is fabricated using a material such as amorphous silicon. Next, a source 212a and two drains 212b, 212c are formed over the channel layer 206. In the meantime, a data line 211 having connection with the source 212a is formed over the gate dielectric layer 204. The gate 202, the channel layer 206, the source 212a and the two drains 212b, 212c together constitute a double drain thin film transistor (double drain TFT) 230. The double TFT is located in the middle of the pixel structure.

In this invention, an ohmic contact layer 214 is also formed between the channel layer 206 and the source 212a and the two drains 212b, 212c for increasing electrical contact between the two.

A passivation layer 214 is formed over the substrate 200 covering the double drain thin film transistor 230. The passivation layer 214 is fabricated using an insulating material such as silicon nitride. Thereafter, two openings 216a, 216b are formed in the passivation layer 214 such that the opening 216a exposes the drain 212b and the opening 216b exposes the drain 212c. Next, a transparent pixel electrode 218 is formed over the passivation layer 214. The transparent pixel electrode 218 is electrically connected to the drains 212b, 212c through the openings 216a and 216b respectively. For the transparent pixel electrode 218 above the scan line 201, a plurality of openings 219 is patterned to reduce parasitic capacitance between the transparent pixel electrode 218 and the scan line 201.

In addition, the two edges of the pixel structure according to this invention may further include two pixel storage capacitors 220a and 220b. The pixel storage capacitor 220a, 220b are constructed from two common lines 222a, 222b (as lower electrodes), two conductive layers 224a, 224b and a transparent pixel electrode 218 (as an upper electrode) and a gate dielectric layer 204. The two conductive layers 224a, 224b and the transparent pixel electrode 218 are positioned above the two common lines 222a, 222b and the gate dielectric layer 204 are positioned between the upper electrode and the lower electrodes. The common lines 222a, 222b and the scan line 201 are patterned in the same process. The transparent pixel electrode 218 and the conductive layers 224a, 224b are electrically connected (having the same potential) through the two openings 226a, 226b in the passivation layer 214.

Hence, the pixel structure according to this invention includes a scan line 201, a gate dielectric layer 204, a data line 211, a passivation layer 214, a transparent pixel electrode 218 and a double drain thin film transistor (double drain TFT) 230.

The scan line 201 is positioned over the substrate 200 and the gate dielectric layer is positioned over the substrate 200 covering the scan line 202. The data line 211 is positioned over the gate dielectric layer 204. The data line 211 extends in a direction different from the scan line 201. The passivation layer 214 is positioned over the gate dielectric layer 204 covering the data line 211. The transparent pixel electrode 218 is positioned over the passivation layer 214. That portion of the transparent pixel electrode 218 above the scan line 201 has a plurality of openings 219 for reducing parasitic capacitance between the scan line 201 and the transparent pixel electrode 218. The double TFT 230 is positioned over the substrate 200 in the middle of the pixel structure. The double TFT 230 has a gate 202, a channel layer 206, a source 212a and two drains 212b, 212c. The source 212a and the data line 211 are electrically connected. The drains 212b, 212c are electrically connected to the transparent pixel electrode 218. The channel layer 206 is positioned over the gate dielectric layer 204 above the gate 202. The source 212a and the two drains 212b, 212c are positioned over the channel layer 206. The gate 202 and the scan line 201 are electrically connected.

In addition, the two edges of the pixel structure according to this invention may further include two pixel storage capacitors 220a and 220b. The pixel storage capacitor 220a, 220b are constructed from two common lines 222a, 222b (as lower electrodes), two conductive layers 224a, 224b and a transparent pixel electrode 218 (as an upper electrode) and a gate dielectric layer 204. The two conductive layers 224a, 224b and the transparent pixel electrode 218 are positioned above the two common lines 222a, 222b and the gate dielectric layer 204 are positioned between the upper electrode and the lower electrodes. The transparent pixel electrode 218 and the conductive layers 224a, 224b are electrically connected through the two contacts 226a, 226b in the passivation layer 214.

The pixel structure in the aforementioned embodiment is a transparent pixel structure. Since the area in the transparent region of the pixel structure according to this invention is divided into two equal portions, quality of the display will improve if the pixels in the display are arranged in a delta type configuration.

Figure 5:
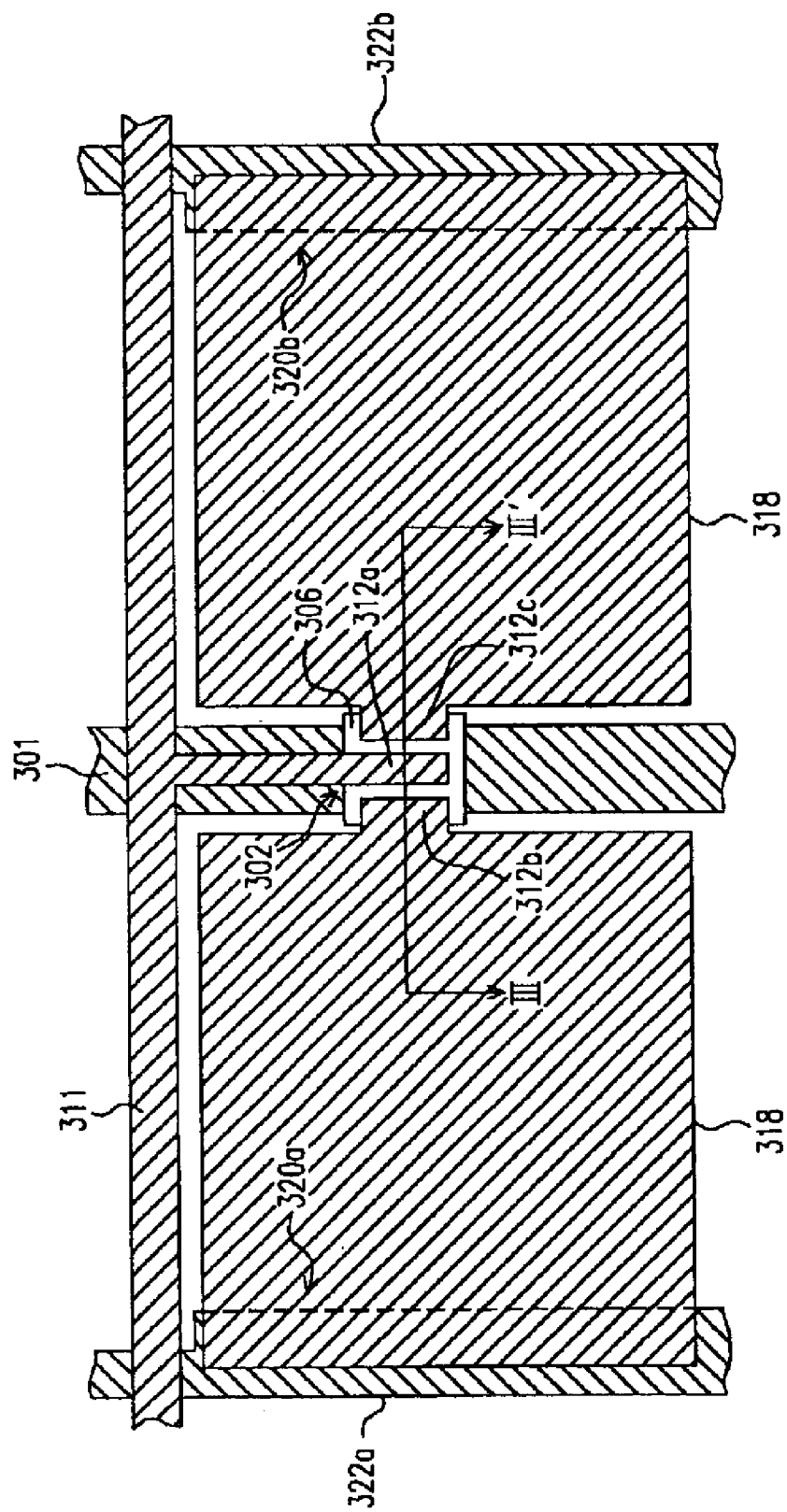
FIG. 5 is the top view of a pixel structure according to a second embodiment of this invention.
Figure 7:
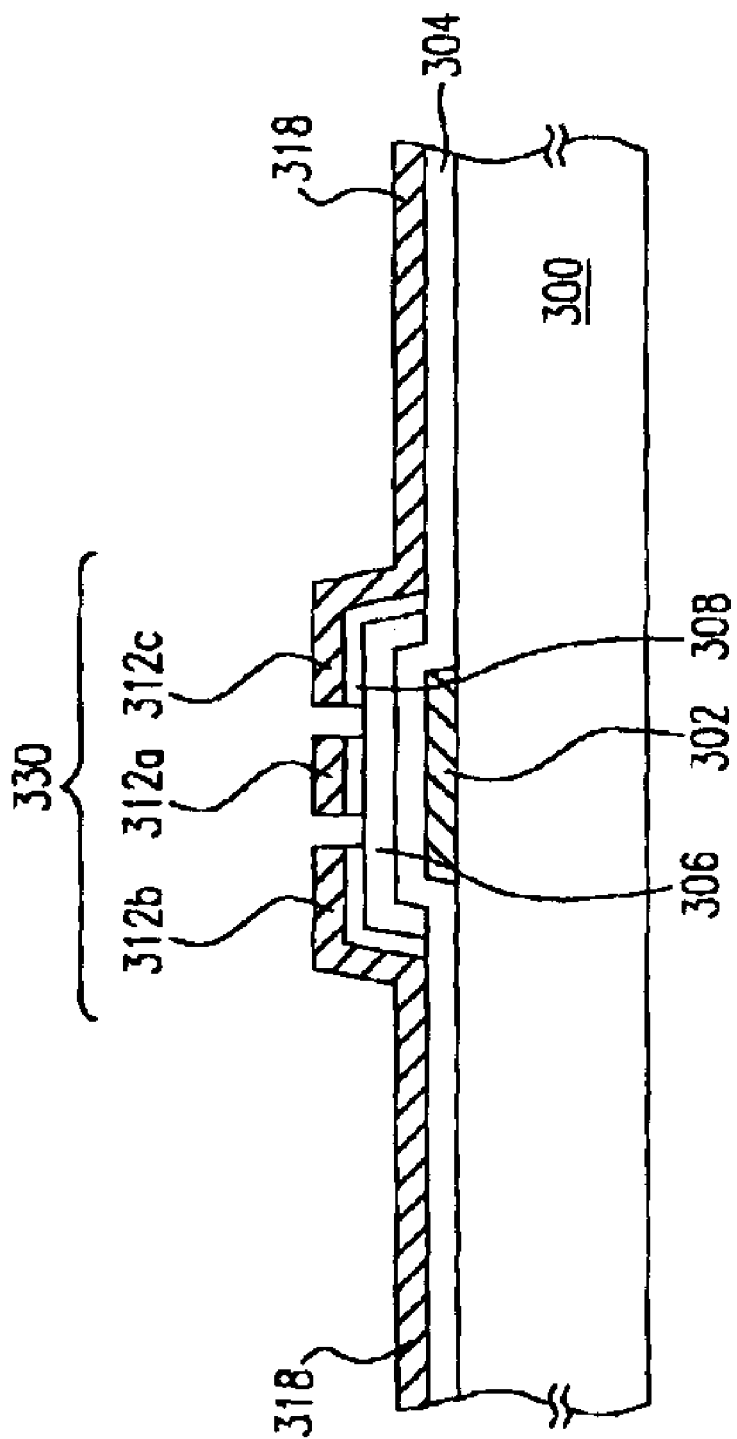
FIG. 7 is a sectional view through line III–III" and line IV–IV" of FIGS. 5 and 6 respectively.

FIG. 5 is the top view of a pixel structure according to a second embodiment of this invention and FIG. 7 is a sectional view through line III–III" of FIG. 5. As shown in FIGS. 5 and 7, a substrate 300 such as a transparent glass substrate or a transparent plastic substrate is provided. A scan line 301 and a gate 302 are formed over the substrate 300 such that the scan line 301 and the gate 302 are electrically connected.

Thereafter, a gate dielectric layer 304 is formed over the substrate 300 globally covering the scan line 301 and the gate 302. The gate dielectric layer 304 is fabricated using a dielectric material including silicon nitride or silicon oxide, for example.

A channel layer 306 is formed over the gate dielectric layer 304 above the gate 302. The channel layer 306 is fabricated using a material such as amorphous silicon.

Next, a source 312a and two drains 312b, 312c are formed over the channel layer 306. At the same time, a data line 311 having connection with the source 312a and a reflective pixel electrode 318 having connection with the drains 312b, 312c is formed over the gate dielectric layer 304. The reflective pixel electrode 318 is fabricated using a metallic material. The gate 302, the channel layer 306, the source 312a and the two drains 312b, 312c together constitute a double drain thin film transistor (double drain TFT) 330. The double drain TFT 330 is positioned in the middle of the pixel structure. In this embodiment, an ohmic contact layer 308 is also formed between the channel layer 306 and the source 312a and the two drains 312b, 312c for increasing electrical contact between the two.

Figure 6:
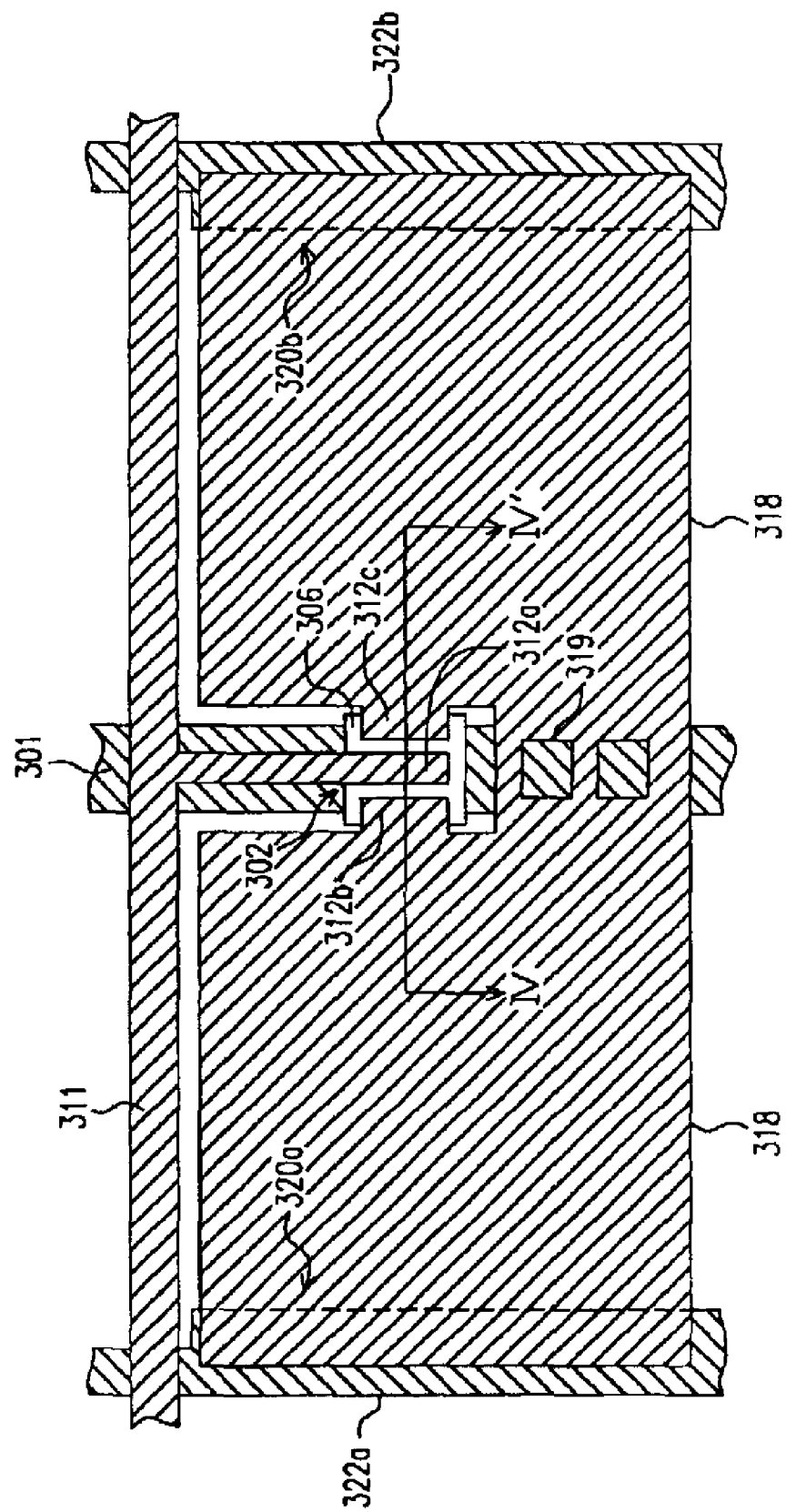
FIG. 6 is the top view of a pixel structure according to a third embodiment of this invention.

In addition, the reflective pixel electrode 318 may be patterned into two separate blocks of reflective pixel electrodes 318 (as show in FIG. 5) with one block on each side of the scan line 301. Moreover, the two blocks of reflective pixel electrode 318 are electrically connected to the respective drains 312b, 312c so that parasitic capacitance between the pixel electrode 318 and the scan line 301 is reduced. Alternatively, the reflective pixel electrode 318 is patterned as a single block of reflective pixel electrode 318 (as shown in FIG. 6). In this case, a plurality of openings 319 is patterned in the reflective pixel electrode 318 above the scan line 301 to reduce parasitic capacitance between the reflective pixel electrode 318 and the scan line 301.

In addition, the two edges of the pixel structure according to this invention may further include two pixel storage capacitors 320a and 320b. The pixel storage capacitor 320a, 320b are constructed from two common lines 322a, 322b (as lower electrodes), the reflective pixel electrode 318 (as an upper electrode) and a gate dielectric layer 304. The reflective pixel electrode 318 is positioned above the two common lines 322a, 322b and the gate dielectric layer 304 is positioned between the upper electrode and the lower electrodes. The common lines 322a, 322b, the scan line 301, the gate 302 are patterned in the same process.

Therefore, the pixel structure according to this invention includes a scan line 301, a gate dielectric layer 304, a data line 311, a reflective pixel electrode 318 and a double drain thin film transistor (double drain TFT) 330.

The scan line 301 is positioned over the substrate 300 and the gate dielectric layer 304 is positioned over the substrate 300 covering the scan line 302. The data line 311 is positioned over the gate dielectric layer 304. The data line 311 extends in a direction different from the scan line 301. The reflective pixel electrode 318 is positioned over the gate dielectric layer 304. Here, the reflective pixel electrode 318 may comprise of two blocks of reflective pixel electrodes 318 with one block on each side of the scan line 301. Alternatively, a single block of reflective pixel electrode 318 may be used. In this case, however, a plurality of openings 319 is formed in the reflective pixel electrode 318 above the scan line 301 for reducing parasitic capacitance between the scan line 301 and the reflective pixel electrode 318. The double TFT 330 is positioned over the substrate 300 in the middle of the pixel structure. The double TFT 330 has a gate 302, a channel layer 306, a source 312a and two drains 312b, 312c. The source 312a and the data line 311 are electrically connected. The drains 312b, 312c are electrically connected to the reflective pixel electrode 318. The channel layer 306 is positioned over the gate dielectric layer 304 above the gate 302. The source 312a and the two drains 312b, 312c are positioned over the channel layer 306. The gate 302 and the scan line 301 are electrically connected.

In the aforementioned embodiment, the two edges of the pixel structure may further include two pixel storage capacitors 320a and 320b. The pixel storage capacitor 320a, 320b are constructed from two common lines 322a, 322b (as lower electrodes), a reflective pixel electrode 318 (as an upper electrode) and a gate dielectric layer 304. The reflective pixel electrode 318 is positioned above the two common lines 322a, 322b and the gate dielectric layer 304 is positioned between the upper electrode and the lower electrodes.

The pixel structure in the aforementioned embodiment is a reflective pixel structure. Since the area in the transparent region of the pixel structure according to this invention is divided into two equal portions, quality of the display will improve if the pixels in the display are arranged in a delta type configuration.

In summary, major advantages of this invention includes:

1. Since the thin film transistor is positioned in the middle of the pixel structure and the two drains of the thin film transistor are capable of driving the pixel electrode on each side, the pixel structure is less vulnerable to the damaging effect of contaminating particles.

2. By positioning the thin film transistor in the middle of the pixel structure, a more uniform electric field distribution across the surface of the pixel electrode is produced and hence has a positive effect on the display.

3. Unlike the conventional design of positioning the pixel storage capacitor over the scan line, the pixel structure according to this invention is not formed over a scan line and hence has a simpler driving circuit design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure on a substrate, comprising:
   a scan line over the substrate;
   a gate dielectric layer over the substrate covering the scan line;
   a data line over the gate dielectric layer, wherein the data line extends in a direction different from the scan line;
   a passivation layer over the gate dielectric layer covering the data line;
   a transparent pixel electrode over the passivation layer; and
   a double drain thin film transistor over the substrate in the middle of the pixel structure, wherein the double drain thin film transistor has a gate, a channel, a source and two drains such that the source and the data line are electrically connected, the two drains and the transparent pixel electrode are electrically connected, the channel layer is positioned over the gate dielectric layer above the gate, the source and the two drains are positioned over the channel layer and that the gate and the scan line are electrically connected.

2. The pixel structure of claim 1, wherein the structure may further include two pixel storage capacitors located on two side edges of the pixel structure.

3. The pixel structure of claim 2, wherein each pixel storage capacitor includes a common line on the substrate, a conductive layer and the transparent pixel electrode above the common line and a gate dielectric layer between the common line and the conductive layer/transparent pixel electrode and that the conductive layer and the transparent pixel electrode are electrically connected.

4. The pixel structure of claim 1, wherein the transparent pixel electrode above the scan line may further include a plurality of openings for reducing parasitic capacitance between the scan line and the transparent pixel electrode.

5. The pixel structure of claim 1, wherein material constituting the transparent pixel electrode includes indium-tin oxide.

6. The pixel structure of claim 1, wherein the structure may further include an ohmic contact layer between the channel layer and the source and between the channel layer and the two drains.

7. A pixel structure on a substrate, comprising:
   a scan line over the substrate;
   a gate dielectric layer over the substrate covering the scan line;
   a data line over the gate dielectric layer, wherein the data line extends in a direction different from the scan line;
   a reflective pixel electrode over the gate dielectric layer; and
   a double drain thin film transistor over the substrate in the middle of the pixel structure, wherein the double drain thin film transistor has a gate, a channel layer, a source and two drains, the source and the data line are electrically connected, the two drains and the reflective pixel electrode are electrically connected, the channel layer is positioned over the gate dielectric layer above the gate, the source and the two drains are positioned over the channel layer and that the gate and the scan line are electrically connected.

8. The pixel structure of claim 7, wherein the structure may further include two pixel storage capacitors located on two side edges of the pixel structure.

9. The pixel structure of claim 8, wherein each pixel storage capacitor includes a common line on the substrate, a reflective pixel electrode above the common line and a gate dielectric layer between the common line and the reflective pixel electrode.

10. The pixel structure of claim 7, wherein the reflective pixel electrode above the scan line may further include a plurality of openings for reducing parasitic capacitance between the scan line and the reflective pixel electrode.

11. The pixel structure of claim 7, wherein material constituting the reflective pixel electrode includes a metallic substance.

12. The pixel structure of claim 7, wherein the structure may further include an ohmic contact layer between the channel layer and the source and between the channel layer and the two drains.

13. A pixel structure on a substrate, comprising:
   a double drain thin film transistor over the substrate in the middle of the pixel structure, wherein the double drain thin film transistor has a gate, a channel layer, a source and two drains;
   a scan line over the substrate, wherein the scan line and the gate of the double drain thin film transistor are electrically connected;
   a data line over the substrate, wherein the data line extends in a direction different from the scan line and that the data line and the source of the double drain thin film transistor are electrically connected; and
   a pixel electrode over the substrate, wherein the pixel electrode and the two drains of the double drain thin film transistor are electrically connected.

14. The pixel structure of claim 13, wherein the structure may further include a first pixel storage capacitor and a second pixel storage capacitor on two side edges of the pixel structure.

15. The pixel structure of claim 13, wherein the pixel electrode above the scan line may further include a plurality of opening for reducing parasitic capacitance between the scan line and the pixel electrode.

16. The pixel structure of claim 13, wherein the pixel electrode includes a transparent pixel electrode.

17. The pixel structure of claim 13, wherein the pixel electrode includes a reflective pixel electrode.

18. The pixel structure of claim 13, wherein the structure may further include an ohmic contact layer between the channel layer and the source and between the channel layer and the two drains.

* * * * *